(12) United States Patent
Lee et al.

(10) Patent No.: US 8,510,074 B2
(45) Date of Patent: Aug. 13, 2013

(54) MOVING LIGHT TABLE

(75) Inventors: Robin Lee, Hamburg, NJ (US); Chris Conti, West New York, NJ (US)

(73) Assignee: Production Resource Group, LLC, New Windsor, NY (US)

( * ) Notice: Subject to any disclaimer, the term of this patent is extended or adjusted under 35 U.S.C. 154(b) by 0 days.

(21) Appl. No.: 13/302,643

(22) Filed: Nov. 22, 2011

(65) Prior Publication Data

US 2012/0069588 A1    Mar. 22, 2012

Related U.S. Application Data

(63) Continuation of application No. 11/945,225, filed on Nov. 26, 2007.

(60) Provisional application No. 60/867,382, filed on Nov. 27, 2006.

(51) Int. Cl.
  *G01R 31/00* (2006.01)
  *G01R 5/00* (2006.01)
  *F21S 8/00* (2006.01)
  *F21S 2/00* (2006.01)
  *F21S 8/04* (2006.01)

(52) U.S. Cl.
  USPC ............. 702/117; 702/33; 362/418; 362/427; 362/419

(58) Field of Classification Search
  USPC ...................... 702/81, 150, 151, 94, 33, 117; 324/405–408; 356/72–73, 139.03–139.06, 356/399–400; 362/418, 427, 419
  See application file for complete search history.

(56) References Cited

U.S. PATENT DOCUMENTS

| | | | | |
|---|---|---|---|---|
| 4,716,344 | A * | 12/1987 | Newell et al. | 315/312 |
| 4,980,806 | A | 12/1990 | Taylor et al. | |
| 6,008,636 | A | 12/1999 | Miller et al. | |
| 7,505,064 | B2 * | 3/2009 | Knoedgen et al. | 348/187 |
| 8,065,106 | B2 * | 11/2011 | Lee et al. | 702/117 |
| 2001/0017253 | A1 | 8/2001 | Patel et al. | |
| 2007/0069761 | A1 * | 3/2007 | Shi et al. | 324/765 |

* cited by examiner

*Primary Examiner* — Marc Armand
*Assistant Examiner* — Ricky Ngon
(74) *Attorney, Agent, or Firm* — Law Office of Scott C. Harris, Inc.

(57) ABSTRACT

A moving light test system allows connecting moving lights to an interface board and conveying the lights and orienting and testing the lights while they are attached to the board. The lights can be mechanically and electrically connected to the board, and once connected, can be tested in multiple ways without reconfiguring or removing the lights. The board has a connector that can be plugged in at various locations, and the board can also be handled by mechanical devices. In this way, once the light is connected to the board, it does not need to be re-handled. In addition, lights can be tested in different orientations.

14 Claims, 3 Drawing Sheets

Ellipsis.

MOVING LIGHT TABLE

This application is a continuation application of U.S. Ser. No. 11/945,225 filed Nov. 26, 2007, now U.S. Pat. No. 8,065,106, which claims priority from U.S. provisional application No. 60/867,382, filed Nov. 27, 2006, the disclosure of which is herewith incorporated by reference.

BACKGROUND

Lights for stage and production operations are often heavy and awkward. These lights are intended to be remotely controlled, and also to project a high intensity light. The lights often include special bulbs and ballasts. The lights are mountable on trusses, but often very difficult to handle. Many devices, for example, require two men to carry them.

The lights are often rented, and after the rental is completed, they must be tested to be readied for the next rental. This means testing the lights.

SUMMARY

The present application teaches a special moving table and system that allows the lights to be automatically handled, tested and cleaned.

DETAILED DESCRIPTION

The general structure and techniques, and more specific embodiments which can be used to effect different ways of carrying out the more general goals, are described herein.

This application recognizes that multiple handling of lights after a rental or other hire is inefficient. According to the present system, a device is disclosed which allows manually handling the lights only a single time, after which the lights are automatically processed. In an embodiment, the lights are attached both mechanically and electrically to an interface board that allows the lights to be electronically handled and also tested.

The embodiment refers to handling and control of "moving lights", which in an embodiment are devices that are remotely controllable to move in pan and tilt directions, based on controls from a remote console. Moving lights also have beam parameters, like hue, saturation, beam size, intensity, and pattern that are all remote controllable as well as the above referenced pan and tilt. The moving lights may be of a type that has a base connection, and a moving head that is connected to and controlled by electronics in the base connection.

In an embodiment, a crane or other comparable device can be used to handle the lights. For example, the crane can be maneuvered to turn the lights upside down, an otherwise difficult operation. The crane can also be used to raise and lower the lights in and out of road cases and on and off the table.

Figure 1A:
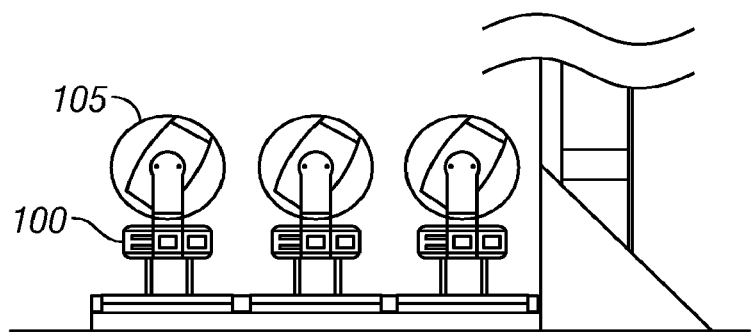
FIGS. 1A-1C show handling of the lights.
Figure 1B:
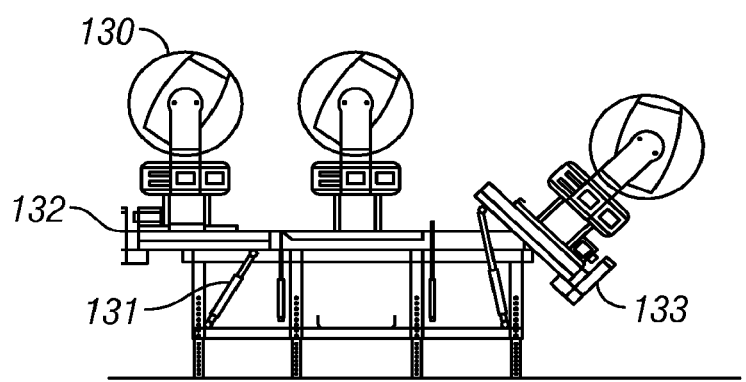
Figure 1C:
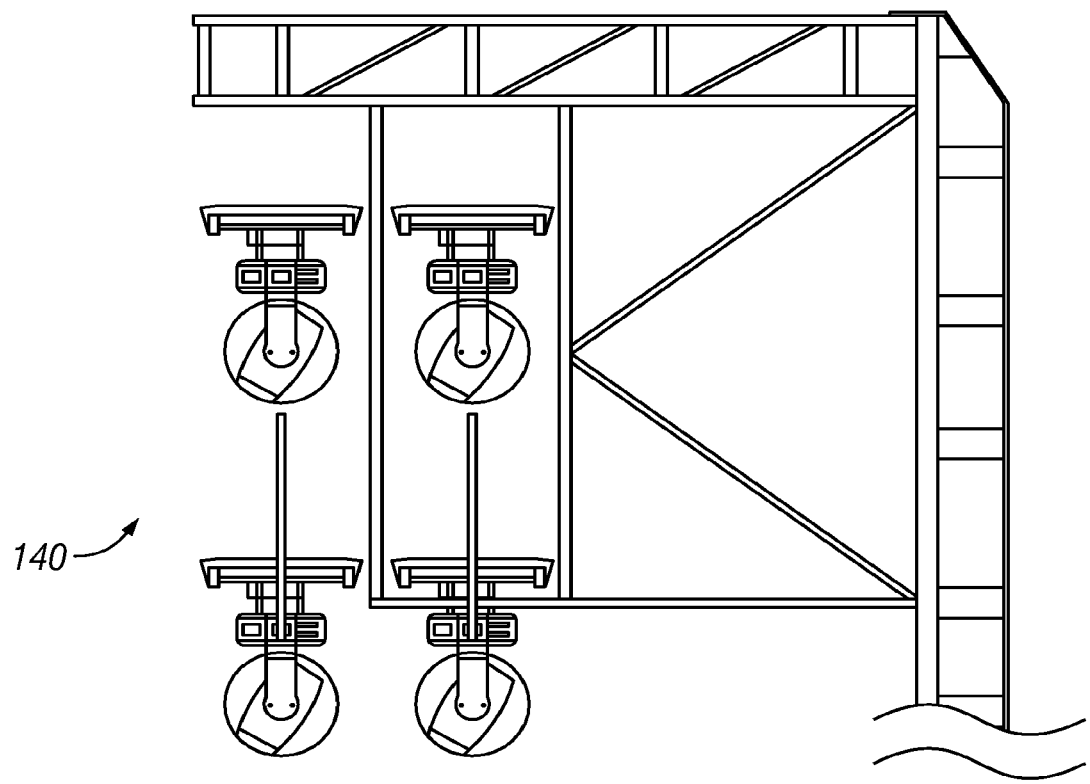

FIGS. 1A-1C illustrate an embodiment that shows the way that the lights are handled.

When the lights are first removed from the truck or other transportation device, they are usually placed "upside down", with the light part facing up, as shown in FIG. 1A. The lights are formed of two parts: a base part such as 100, and a light producing part 105. The light producing part 105 is movable relative to the control part 100. When the lights are hung on trusses, the base part is connected to the truss, while the moving part 105 is controlled by and moved relative to the truss. However, the base part is often much heavier than the moving part (since the control part forms the anchor and never really needs to move). Accordingly, the lights can be maneuvered to place the control part downward. However, this is not the position in which the lights will be used, and hence this may not be the optimum position to test those lights.

Figure 2:
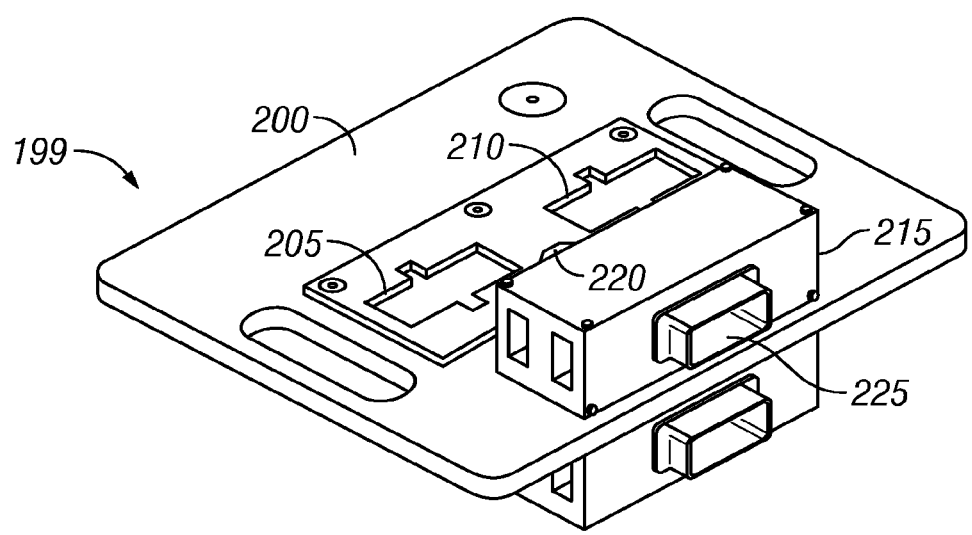
FIG. 2 shows an interface board.

In the embodiment, the lights are attached to a special interface board which is shown in FIG. 2. The interface board is referred to as a "boogie board". The boogie board includes a light mounting surface 200, and also includes a connection portion 205 which includes connections that can make a connection to portions of the light which normally interface to the clamps that are used to hang the light. The light is connected to the connection portions 205, 210. The connection is then tightened to be thereby held on the interface board. An electrical connector portion 215 includes a light interfacing connector part 220, and a test interfacing connector part 225. These two connectors may be configurable depending on the light which is used, for example. The light interfacing connector 220 connects to the light which is attached to the board 200. This provides power and control signals on the light's normal connectors for power and data. The power and control may be a generic connector with pigtail connections that are intended for use with multiple different devices, or it may be specific connectors that are directly connected into connectors on the light.

There may be more than two connectors on the Plug box, e.g., an XLR 5 pin for DMX, AMP 19 pin connector for Vari-Lite S300 lights that need Low voltage power, communication, and bulb power. An L620 connector may be provided for 208 volt power, a stagepin connector for 110 volt non dim power, another stagepin connector for 110 volt dimming, and finally an RJ45 Ethernet connector. More generally, there may be multiple connectors for multiple types of power and data configurations.

For example, the connectors may provide XLR connections for the DMX connection, and may also provide standard kinds of power connections. Connector 225 may similarly be configured in this way.

Once the light is connected on the interface board 199, it can be automatically handled using a crane or winch. FIG. 1B illustrates how the lights can be placed on a table which allows the lights to be moved and tilted. The light 130 is placed on the table in a position where it can be moved along the table. The table also includes tiltable support parts, each controllable by a hydraulic arm 131, which more generally may be, pneumatic, vacuum, or electromagnetic. When the arm 131 is extended, the table is tilted as shown in 133, causing the light to be tilted under power. The light can then be tested in the tilted position. This position is closer to the light's normal operating position, and hence this may be a more realistic way of testing the light's operation. This also puts the maximum amount of physical strain on the light as well. If desired, the lights on the boards can also be handled by a crane and hung from trusses for testing. 140 shows a group of lights being hung from trusses so that the lights can be tested in their normal position.

In this embodiment, the connectors are fully modular connectors, that can be configured in any desired way for any desired light. For example, the connectors may have configurable shapes, pins and other features.

Figure 3:
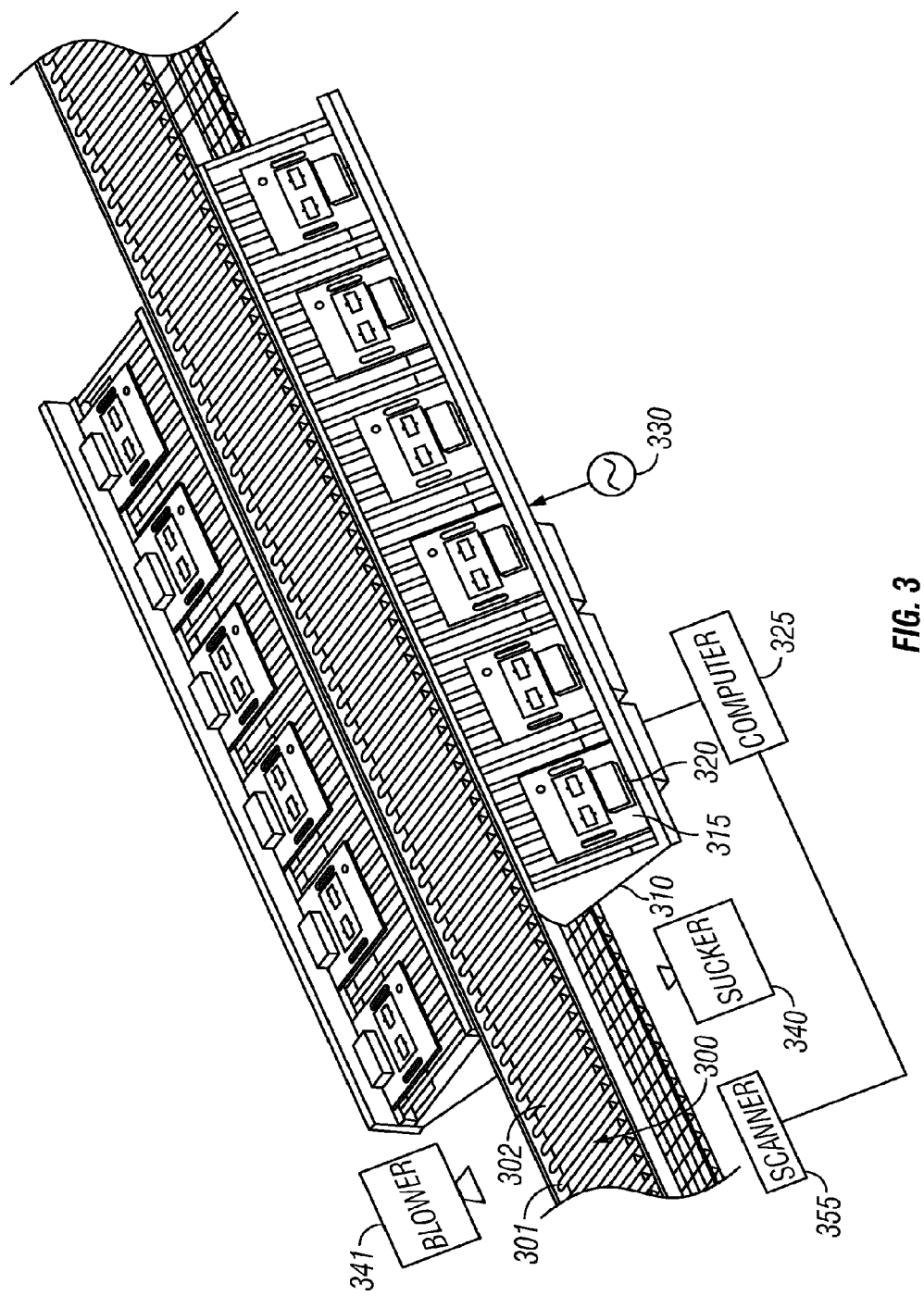
FIG. 3 illustrates the moving light table.

FIG. 3 illustrates the table and its test areas. The lights, on the interface boards, can be placed along the conveyor portion 300 of the table. The conveyor portion may move in an endless loop, moving the lights from one end to the other. Another embodiment may just form the conveyor as rollers along which the boards can be conveyed. In the embodiments, the conveyor portion is formed of slats 301 which allow open areas 302 in between adjacent slats. It may use rollers that are automated by rubber bands around the rollers and connected to a central line shaft with a single driving motor.

One or more testing stations such as 310 are provided. In the embodiment, the testing stations are hydraulically, pneumatically, vacuum, or electromagnetically controlled between a stowed position shown as 132 in FIG. 1B, and a tilted position shown as 133 in FIG. 1A. Each of the test stations have a provision for an interface board to be located, shown as 315. The provision for the interface board includes an electrical connection 320 which plugs into the test interfacing connector part 325. The board hence plugs into the connector 320 and allows powering up and testing the device in various ways. For example, a computer, shown as 325, may provide a test program for each light, either automatically or under operator control. A power source 330 also is connected to the connectors 320, and enables providing AC and/or DC power of various types to power the operations of the light.

In one embodiment, various sections along the conveyor include suction portions 340. The suction portions create a downdraft through the open areas 302 in the slats. There may also be blowers such as 341 which blow on the lights to further remove debris whenever possible. This forms an area which is a downdraft section. Other portions of the workstation may carry out other functions. For example, a barcode scanner 355 may scan a barcode or other identifying indicia on the light to determine information about the light such as its model number or any identifying characteristics.

Once the identifying information has been read, the identifying indicia can indicate specific information about the light. That information can be used to determine information about the light, e.g., directly, or by looking up the information from a database. The looked-up information can include, for example, format and/or type of power to the light, and format of control signals.

The output of the scanner 355 is connected into the computer, to assist the computer in this determination. Moreover, while the scanner is shown separated from the detection stations, it should be understood that the scanner can be located at the detection stations, such that each detection station has its own scanner to facilitate testing of individual lights. As an alternative to a scan, a machine vision device can be used.

In the embodiment, any crane can be used to move the devices, for example a hydraulic crane from Spanco.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other resistance sizes can be used, and other devices can be tested in this way.

Also, the inventors intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The computer may be a Pentium class computer, running Windows XP or Linux, or may be a Macintosh computer. The computer may also be a handheld computer, such as a PDA, cellphone, or laptop.

The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

What is claimed is:

1. A testing system for a light on a light interfacing board, comprising:
 a table holding a structural member, having a surface formed with an area for mounting an electrically controllable moving light, said surface including first and second separated connection portions, each of said connection portions having at least one structural part that connects to portions of a moving light that would normally connected to clamps that are used to hang the moving light, and said structural member also including a dual sided connector part, having at least one first connector at a first side facing said first and second connection portions, said dual sided connector part providing power and signal on said at least one first connector, said dual sided connector part having at least one second connector on a second side of said dual sided connector part, facing away from said first and second separated connection portions, said at least one second connector having at least one connector for receiving power and signal lines,
 said table providing power and signal for said structural member, and
 said table moving said structural member into a tilted position and having a processor for testing the electrically controllable light in the tilted position.

2. The board as in claim 1, wherein said structural member including at least first and second openings adjacent opposite edges and forming handles in the separated connecting portion.

3. The interface board as in claim 1, wherein connectors on said dual sided connector part include a first connector for DMX, a second connector for low voltage, and a third connector for high-voltage.

4. The interface board as in claim 3, wherein said connectors further include an ethernet connector.

5. The interface board as in claim 1, further comprising a moving light connected to the board, such that a base of the moving light is connected to the board, and is connected to receive power and signals from the board.

6. The interface board as in claim 1, wherein said dual sided connector part includes a first part on said surface for mounting said moving light, and a second part on an opposite surface to said surface for mounting said light.

7. The interface board as in claim 6, wherein both said first part and said second part include connectors facing away from said first and second connector portions.

8. The interface board as in claim 1, wherein said dual sided connector part includes a first part on said surface for mounting said light, and a second part on an opposite surface to said surface for mounting said moving light.

9. The testing system as in claim 1, wherein said processor also controls moving said structural member into said tilted position.

10. A method of testing a light on a light interfacing board, comprising:

connecting a moving light of a type having a base and a head that moves independently from said base based on an electrical control over a cable, said connecting using first and second separated connection portions to connect to portions of the moving light that would normally connect to clamps that are used to hang the moving light, electrically connecting said moving light to a first side of a dual sided connector part on said structural member, said dual sided connector part providing power and signal on said at least one first connector, connecting power and signal to at least one second connector on a second side of said dual sided connector part, facing away from said first and second connection portions; and testing said light on said light interfacing board by powering and controlling said moving light using both said power and signal lines moving said structural member into a tilted position and using a processor for testing the electrically controllable light in the tilted position.

11. The method as in claim 10, wherein connectors on said dual sided connector part include a first connector for DMX, a second connector for low voltage, and a third connector for high-voltage.

12. The method as in claim 10, wherein said connectors further include an ethernet connector.

13. The method as in claim 10, further comprising controlling said moving light to move said head while said moving light is attached to said structural member.

14. The method as in claim 10, wherein said processor also controls moving said structural member into said tilted position.

\* \* \* \* \*